United States Patent [19]
Ooka

[11] Patent Number: 5,283,449
[45] Date of Patent: Feb. 1, 1994

[54] SEMICONDUCTOR INTEGRATED CIRCUIT DEVICE INCLUDING TWO TYPES OF MOSFETS HAVING SOURCE/DRAIN REGION DIFFERENT IN SHEET RESISTANCE FROM EACH OTHER

[75] Inventor: Hideyuki Ooka, Tokyo, Japan

[73] Assignee: NEC Corporation, Tokyo, Japan

[21] Appl. No.: 742,380

[22] Filed: Aug. 8, 1991

[30] Foreign Application Priority Data

Aug. 9, 1990 [JP] Japan .................. 2-211109
Aug. 29, 1990 [JP] Japan .................. 2-228688

[51] Int. Cl.$^5$ .............................. H01L 27/02
[52] U.S. Cl. .................. 257/204; 257/371; 257/374
[58] Field of Search .......... 357/71, 71 S, 67 S, 357/41, 59 I, 45; 257/202, 205, 384, 769, 768, 770, 204, 371, 374

[56] References Cited

U.S. PATENT DOCUMENTS

| | | | |
|---|---|---|---|
| 4,587,718 | 5/1986 | Haken et al. | 29/571 |
| 4,657,628 | 4/1987 | Holloway et al. | 156/643 |
| 4,769,686 | 9/1988 | Horiuchi et al. | 357/71 S |
| 4,901,134 | 2/1990 | Misawa et al. | 357/71 S |
| 5,060,037 | 10/1991 | Rountree | 357/42 |
| 5,060,046 | 10/1991 | Shintani | 357/45 |

FOREIGN PATENT DOCUMENTS

61-207051 9/1986 Japan .

OTHER PUBLICATIONS

Patent Abstracts of Japan, vol. 11, No. 41 (E-478)(24488), 6 Feb. 1987.
C. K. Lau et al., "Titanium Disilicide Self-Aligned Source/Drain+Gate Technology," IEDM 82, pp. 714-717, 1982.
Chen et al., "Electrostatic Discharge Protection For One Micron CMOS Devices and Circuits," IEDM 86, pp. 484-487, 1986.

*Primary Examiner*—William Mintel
*Assistant Examiner*—Ninhloan Tran
*Attorney, Agent, or Firm*—Burns, Doane, Swecker & Mathis

[57] ABSTRACT

In the semiconductor integrated circuit device of the present invention which uses MOSFETs as its components, the gate electrode of the MOSFET is constructed by using a silicide gate, a polycide gate or a metal gate. The source-drain region of the MOSFET for the internal circuit which does not require connection to an external circuit has a silicide structure, and the source-drain region of the MOSFET for the buffer circuit which requires a direct connection to an external device has a region which is not of silicide structure at least in a portion adjacent to the gate electrode. The gate electrode and the source-drain region of the internal circuit have low resistances so that it is possible to realize an increase in the operating speed by using them as a part of the wirings. Further, in the source-drain region of the buffer circuit there is provided a region of high resistance in the vicinity of the gate electrode so that it is possible to enhance the ESD resistance.

6 Claims, 10 Drawing Sheets

SEMICONDUCTOR INTEGRATED CIRCUIT DEVICE INCLUDING TWO TYPES OF MOSFETS HAVING SOURCE/DRAIN REGION DIFFERENT IN SHEET RESISTANCE FROM EACH OTHER

BACKGROUND OF THE INVENTION

1. Field of the Invention

The present invention relates to a semiconductor integrated circuit device containing MOSFETs and a method of fabricating the same. More particularly, the present invention relates to a semiconductor integrated circuit device including MOSFETs having metal silicide films on the surface of source and drain regions and a method of fabricating the same.

2. Description of the Prior Art

In semiconductor integrated circuit devices, reduction in the element dimension has been progressing rapidly due to increase in the device density and increase in the operating speed. Further, in semiconductor integrated circuit devices including MOSFETs, suppression of the short channel effect of the MOSFETs is also required. For this purpose, source and drain regions are made shallow. However, making the junction of the source-drain diffused layer shallow brings about an increase in the sheet resistance thereof. Since the source and drain diffused layers and the gate electrodes are used as a part of the wirings, the increase in the sheet resistance of the diffused layers and the reduction in the size of the gate electrodes causes an increase in the wiring resistance to lower the operating speed of the circuit.

The increase in the sheet resistance of the gate electrode due to the reduction in the size thereof can be prevented by using suitable material for the gate electrodes. In recent years, in place of a gate electrode only made of a polycrystalline silicon film (the so-called silicon gate electrode), a gate electrode having a structure of laminating a metal silicide film on a polycrystalline silicon film (the so-called polycide structure) or a gate electrode only made of a metal silicide film has been used. Further, a gate electrode made of a refractory metal has been employed.

On the other hand, concerning the sheet resistance, a structure for reducing the sheet resistance of regions was disclosed in IEDM Tech. Dig., 1982, pp. 714-717 by C. K. Lau et al. According to this structure, a metal film is deposited on the surface of a diffused layer (or region) formed in the surface portion of a silicon substrate, a silicification reaction is induced by heat treatment between silicon of the diffused layer and the metal film, the metal film left unreacted being thereafter removed. Thus, a metal silicide film is formed in a self-aligned fashion with respect to the diffused layer. The structure of the MOSFET obtained thus is called "salicide" (abbreviation for self-aligned silicide). The sheet resistance of the diffused layer is thereby converted from several tens to one hundred and several tens of ohms/square ($\Omega/\square$) into several ohms/square ($\Omega/\square$).

However, a MOSFET with the silicide structure has resistance against electrostatic discharge (called hereinafter "ESD resistance") that is remarkably smaller than the ESD of a MOSFET not having the silicide structure, as reported by K. L. Chen, et al, in IEDM Tech. Dig., 1986, pp. 484-487. According to the present inventor, moreover, ESD resistance of a MOSFET with the silicide structure is about one-third of that of a MOSFET not having the silicide structure.

The reason for this can be considered as follows. That is, the silicide structure reduces the resistance of the diffused layer itself. When a discharge current due to static electricity flows into the diffused layer (in particular the drain diffused layer) of a MOSFET, therefore, the current tends to concentrate at the portion of the layer just under the end part of the gate electrode. Consequently, a local thermal breakdown is apt to be generated in the gate insulating film in the vicinity of the gate electrode end part. The MOSFET is thereby destroyed. Thus, MOSFETs with the silicide structure in buffer circuits such as an input buffer circuit, an output buffer circuit and an I/O buffer circuit deteriorate EDS resistance of an integrated circuit device.

SUMMARY OF THE INVENTION

It is an object of the present invention to provide an improved semiconductor integrated circuit device adapted for increasing the operating speed.

It is another object of the present invention to provide a semiconductor integrated circuit device for increasing the operating speed without reducing the ESD resistance.

It is still another object of the present invention to provide a method of fabricating a semiconductor integrated circuit device operating at a high speed with large ESD resistance.

A semiconductor integrated circuit device according to one aspect of the present invention includes a first MOSFET employed in a buffer circuit for interfacing with an external device and a second MOSFET employed in an internal circuit. Each of the gate electrodes of the first MOSFET and the second MOSFET is made of a first metal, or a silicide film of the first metal, or a laminated film consisting of a polycrystalline silicon film and a silicide film of the first metal. The first MOSFET has a silicide film of a second metal that is provided on the surface of a source and/or drain region away from the gate electrode thereof, whereas the second MOSFET has the silicide film of the second metal that is provided on the surface of a source/drain region adjacent to the gate electrode thereof. It is convenient that the first metal is selected from tungsten, molybdenum and titanium and that the second metal is selected from titanium, cobalet and tantalum.

Since each of the first and second MOSFETs is lowered in resistance of the gate electrode and the second MOSFET has low resistance in the source-drain diffused layer, a high speed operation is performed. Moreover, the ESD resistance of this semiconductor integrated circuit device is high because the first MOSFET has selectively high resistance in the source-drain region adjacent to the gate electrode.

According to another aspect of the present invention, a semiconductor integrated circuit device includes a first MOSFET employed in buffer circuits interfacing with an external device and a second MOSFET employed in an internal circuit. Each of the first MOSFET and the second MOSFET has a gate electrode made of a first metal, or a silicide film of the first metal, or a laminated film of a polycrystalline silicon film and a silicide film of the first metal. The second MOSFET has a silicide film of a second metal that is provided on the surface of the source-drain diffused layer, whereas the first MOSFET is not provided with a silicide film on a source-drain region thereof. It is desirable that the first metal is tungsten, molybdenum or titanium, and that the second metal is titanium, cobalet or tantalum.

Also in this semiconductor integrated circuit device, a high speed operation is performed similar to the semiconductor integrated circuit device according to the first aspect of the present invention. With respect to ESD resistance, on the other hand, the first MOSFET has no silicide film on the source-drain region to provide higher resistance thereof, and hence the ESD resistance becomes higher than that of the semiconductor integrated circuit device according to the first aspect of the present invention.

According to the present invention, there is provided a method of fabricating a semiconductor integrated circuit device including a buffer circuit containing a first MOSFET and an internal circuit containing a second MOSFET, the method comprising the steps of forming a buffer circuit forming region and an internal circuit forming region by selectively forming a field insulating film on the surface of a silicon substrate, forming gate insulating films on the surface of the buffer circuit forming region and the internal circuit forming region, forming on the gate insulating films a gate electrode of the first MOSFET and a gate electrode of the second MOSFET by patterning a first metal, or a silicide film of the first metal, or a laminated layer of a polycrystalline silicon film and a silicide film of the first metal, which is formed over the entire surface, forming a low concentration source-drain diffused layer of the first MOSFET and a low concentration source-drain diffused layer of the second MOSFET by using the gate electrode of the first MOSFET and the gate electrode of the second MOSFET as the mask, forming spacers consisting of a first insulating film on the side faces of the gate electrode of the first MOSFET and the gate electrode of the second MOSFET, removing the gate insulating film except for the regions directly beneath the gate electrode of the first MOSFET, the gate electrode of the second MOSFET and the spacers, covering the gate electrode of the first MOSFET and at least a predetermined region adjacent to this gate electrode with a second insulating film, forming a film consisting of a second metal, and forming a silicide film of the second metal by heat treatment.

When the gate electrode of the first MOSFET and the gate electrode of the second MOSFET are made of the first metal, and when the second metal is the same as the first metal, it is preferable that the aforementioned fabrication method according to the present invention further comprises the step of forming a third insulating film over the entire surface after the formation of the first metal or the silicide film of the first metal or the laminated layer of the polycrystalline silicon film and the silicide film of the first metal. The third insulating film thus prevents the first metal or the silicide film of the first metal from being in direct contact with the film of the second metal, so that it is possible to avoid an abnormality in the shapes of the gate electrodes and the surface levels of the channel regions.

BRIEF DESCRIPTION OF THE DRAWINGS

The above-mentioned and other objects, features and advantages of this invention will become apparent by reference to the following detailed description taken in conjunction with the accompanying drawings, wherein.

DETAILED DESCRIPTION OF THE PREFERRED EMBODIMENTS

Figure 1A:
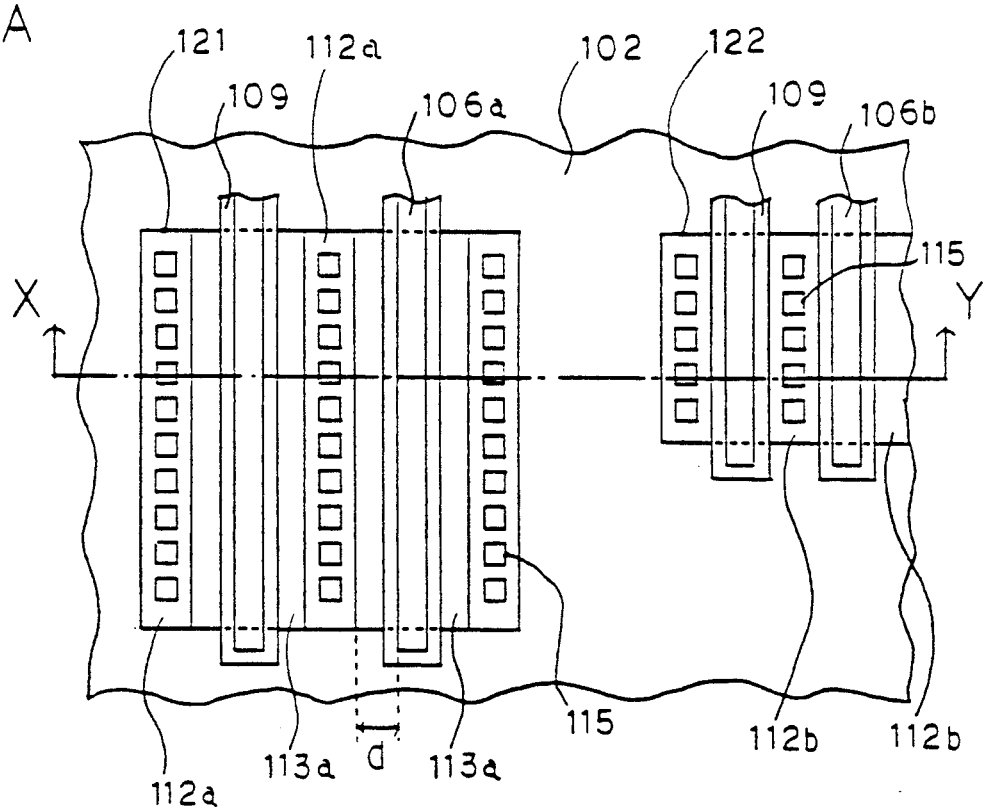
FIG. 1A is a schematic plan view for describing a first embodiment of the present invention.
Figure 1B:
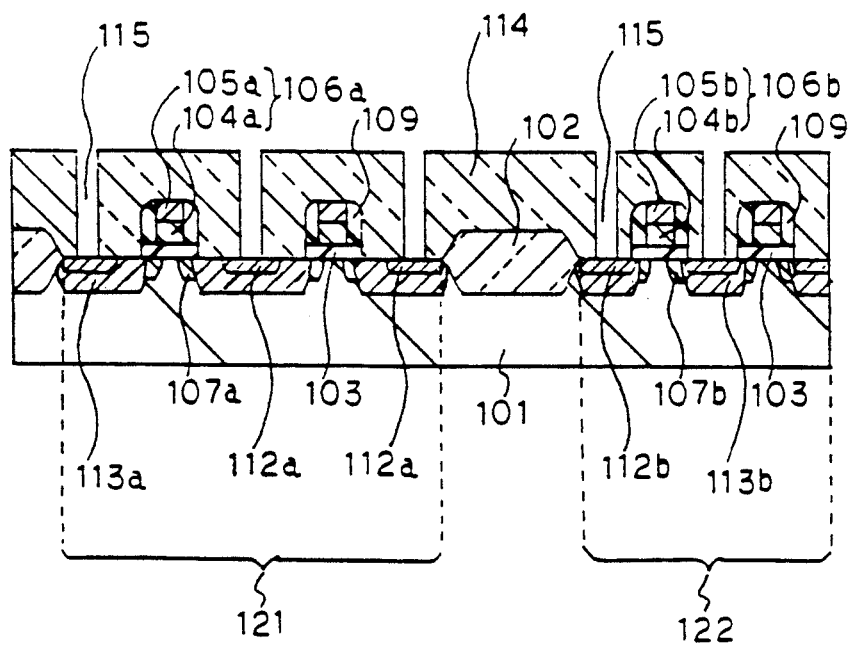
FIG. 1B is a schematic sectional view of the first embodiment along the line XY.

Referring to FIG. 1A and FIG. 1B which show a schematic plan view and a schematic sectional view, respectively, for describing the constitution of the first embodiment of the present invention, the semiconductor integrated circuit device of the present invention is constituted of a buffer circuit (it may be one of the three types of an input buffer circuit, output buffer circuit and I/O buffer circuit, but it will be referred to simply as a buffer circuit hereinafter) that is directly connected to an external device (not shown), and an internal circuit which is coupled via the buffer circuit to the external device. The buffer circuit and the internal circuit can be constructed by a single channel MOSFET, C-MOSFET, or Bi-CMOSFET. For simplicity, the present embodiment will be described by reference to a semiconductor integrated circuit device constructed exclusively by an N-channel MOSFET that has a source-drain diffused layer of a so-called LDD structure.

Selectively formed on the surface of a P-type silicon substrate 101 is a field oxide film 102 having a thickness of about 800 nm. By the presence of the field oxide film 102, the surface of the silicon substrate 101 is partitioned into a buffer circuit region 121 and an internal circuit region 122. In the buffer circuit region 121 and the internal circuit region 122 there are formed a first N-channel MOSFET and a second N-channel MOSFET.

The first and the second MOSFETs have a gate oxide film with thickness of 21.5 nm and gate electrodes 106a and 106b of the polycide structure, respectively. The gate electrode 106a is formed of an N+-type polycrystalline silicon film 104a and a tungsten silicide film 105a, and the gate electrode 106b is formed of an N+-type polycrystalline silicon film 104b and a tungsten silicide film 105b. The thickness of the polycrystalline silicon films 104a and 104b is about 200 nn, and the thickness of the tungsten silicide films 105a and 105b is about 200 nm. The sheet resistance of the gate electrodes 106a and 106b is about 6 Ω/ □. On the side faces of the gate electrodes 106a and 106b there is formed respectively a spacer 109 consisting of a silicon oxide film. The width of the spacer 109 is about 200 nm.

The first and the second MOSFETs have N−-type source-drain diffused layers 107a and 107b, respectively, that are formed in a self-alignment manner with the gate electrodes 106a and 106b. In addition, the first and the second MOSFETs respectively have N+-type source-drain diffused layers 113a and 113b that are formed in a self-alignment manner with the spacer 109 and the gate electrode 106a, and the spacer 109 and the gate electrode 106b. On the surface of the N+-type source and drain diffused layers 113a there are formed titanium silicide films 112a with a distance of d (see FIG. 1A) from the gate electrode 106a. On the other hand, titanium silicide films 112b are formed on the source and drain regions 113b in a self-alignment manner with the spacer 109. The titanium silicide films 112a and 112b have a thickness of about 160 nm, and their sheet resistance is about 2 Ω/square. Note that each of the N+-type source and drain diffused layers 113 and 113b itself has a sheet resistance of about 40 Ω/square.

On the surface of the semiconductor integrated circuit device there is formed an interlayer insulating film 114 with thickness of about 1 μm. In this interlayer insulating film 114 there are provided contact holes 115 which reach the titanium silicide films 112a and 112b. In the present embodiment, the titanium silicide films 112a and 112b function as barrier metals. Because of this, the increase in the contact resistance can be kept small even if the diameter of the contact holes 115 is made small.

The source-drain diffused layer (consisting of an N−-type source-drain diffused layer 107, titanium silicide film 112 and N+-type source-drain diffused layer 113) and the gate electrode in the present embodiment will lead to no inconvenience even if they are diverted as a part of wirings. This is due to the fact that the sheet resistance of the source-drain diffused layers and the gate electrodes in the present embodiment is sufficiently low compared with that of the conventional case.

Moreover, in the first N-channel MOSFET that constitutes the buffer circuit of the present embodiment, the gate electrode 106a and the titanium silicide film 112a are isolated The source-drain region in between is constituted of the N+-type source-drain diffused layer 113a that has a sheet resistance of about 40 Ω/□. Because of this, the thermal breakdown at the edges of the gate electrode 106a will not be conspicuous even if a discharge current flows in from an external device to the source-drain diffused layer 113a of the buffer circuit.

Figure 2A:
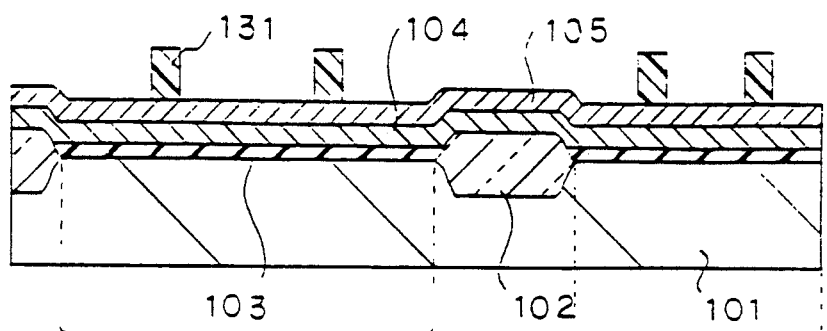
FIGS. 2A to 2H are schematic sectional views arranged in the order of the processes for describing the fabrication method of the semiconductor integrated circuit of the first embodiment.

Next, referring to FIGS. 2A to 2H which show the method of fabrication of the semiconductor integrated circuit described in the above, first, on the surface of a P-type silicon substrate 101, a field oxide film 102 with a thickness of about 800 nm is formed by a selective oxidation method. By the formation of the field oxide film 102, there are formed simultaneously a buffer circuit region 121 and an internal circuit region 122. The regions 121 and 122 are respectively surrounded by the field oxide film 102 (see FIG. 1A). On the surface of the regions 121 and 122 a gate oxide film 103 with thickness of 21.5 nm is formed by a thermal oxidation method. Following that, an N+-type polycrystalline silicon film 104 with a thickness of about 200 nm is formed all over the surface by a CVD method. Then, a tungsten silicide film 105 with a thickness of about 200 nm is deposited all over the surface by a sputtering method. On the tungsten silicide film 105 there is formed a pattern for the photoresist film 131. The photoresist film 131 is the etching mask for the gate electrodes (FIG. 2A). The width of the photoresist film 131 corresponds to the gate length In the present embodiment it is assumed that the gate lengths of the first and the second MOSFETs are equal, but it need not be limited to that case only.

Figure 2B:
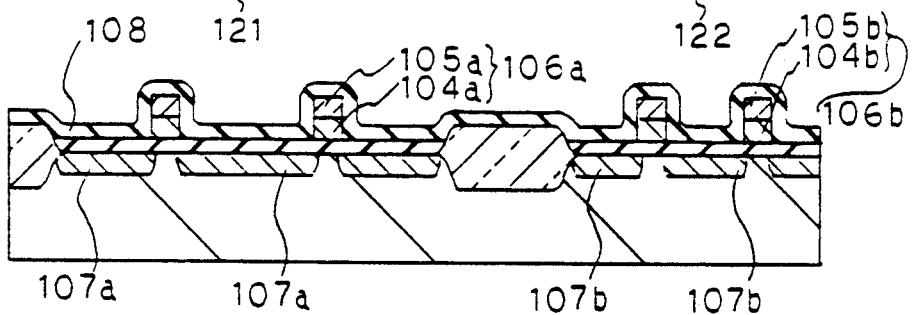

Next, the tungsten silicide film 105 and the polycrystalline silicon film 104 are etched in succession by using the photoresist film 131 as the mask. By this operation, the gate electrodes 106a and 106b with the polycide structure of the first and the second MOSFETs are formed. The gate electrode 106a is formed by the N+-type polycrystalline silicon film 104a and the tungsten silicide film 105a, and the gate electrode 106b is formed by the N+-type polycrystalline silicon film 104b and the tungsten silicide film 105b. The N−-type source-drain regions 107a and 107b of the first and the second MOSFETs are formed by ion implantation of phosphorus. The N−-type source-drain regions 107a and 107b are self-aligned with respect to the gate electrodes 106a and 106b. The implantation energy in the range of 20 to 100 keV and a dose of about $1 \times 10^{13}$ cm$^{-2}$. After removal of the photoresist film 131, a silicon oxide film 108 with a thickness of about 200 nm is deposited all over the surface by a CVD method (FIG. 2B).

Figure 2C:
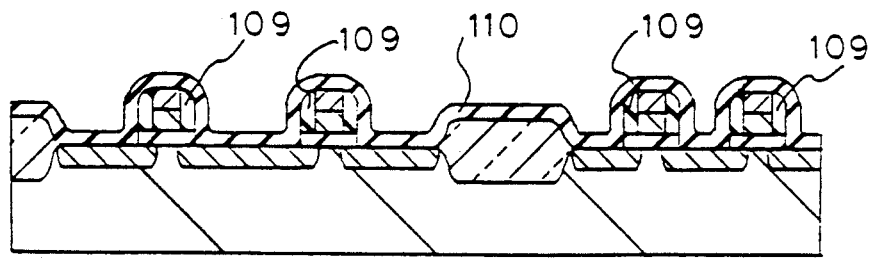

Next, the silicon oxide film 108 is etched back, and a spacer 109 consisting of a silicon oxide film is formed on the side face of the gate electrodes 106a and 106b. Then, a silicon oxide film 110 with a thickness of about 30 nm is deposited all over the surface by a CVD method (FIG. 2C).

Figure 2D:
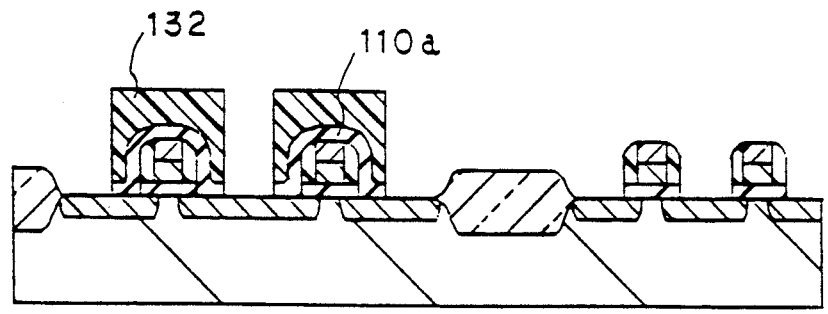

Next, a pattern for the photoresist film 132 is formed on a predetermined region of the buffer circuit region 121. The predetermined region is the region of the gate electrode 106a and the region within a distance d (see FIG. 1A) from the gate electrode 106. A silicon oxide film 110a is formed by etching the silicon oxide film 110 using the photoresist film 132 as the mask (FIG. 2D).

Figure 2E:
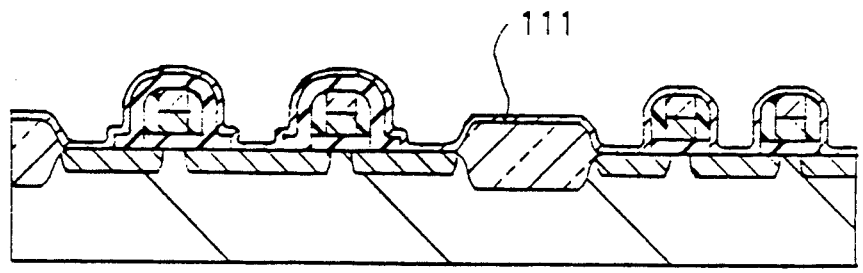

Next, the photoresist film 132 is removed, and a titanium film 111 with thickness of about 100 nm is deposited all over the surface by sputtering (FIG. 2E)

Figure 2F:
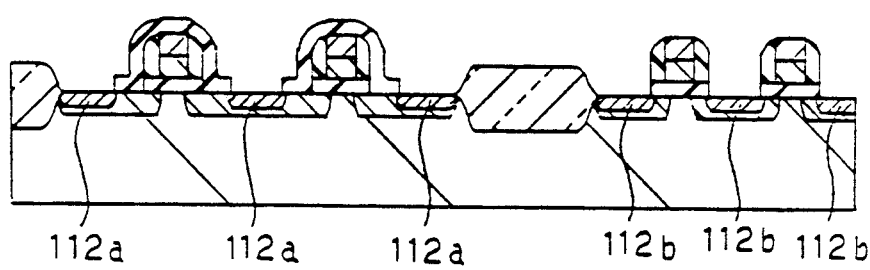

Next, titanium silicide films 112a and 112b are formed by a heat treatment at 600° to 800° C. in an inert atmosphere. The unreacted titanium film 111 is removed by etching (FIG. 2F). At the time of the silicification reaction the tungsten silicide film 105b and the titanium film 111 are in direct contact, but the silicification reaction will not take place in that section.

The fabrication method according to the present embodiment can be applied to the case where a metallic silicide film consisting of the first metal is the component element of the gate electrode by making the first metal (tungsten in the present embodiment) different from the second metal (titanium in the present embodiment). However, the present fabrication method is not applicable when the first metal and the second metal are the same, and when the gate electrode is formed of a metal consisting of the first metal.

Figure 2G:
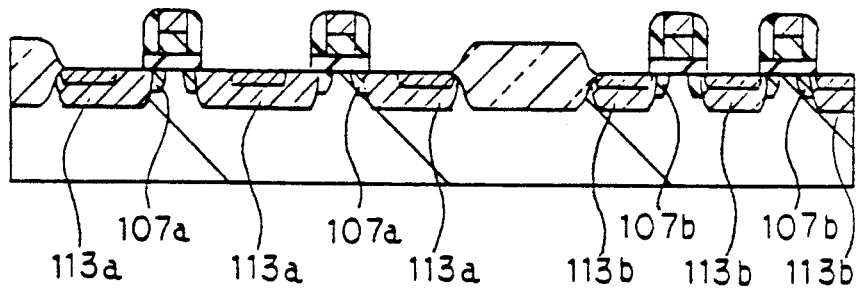

Next, the silicon oxide film is removed. Then, the N+-type source-drain diffused layers 113a and 113b are formed by an arsenic ion implantation that uses the field oxide film 102, the gate electrodes 106a and 106b and the spacers 109 as the mask. The ion implantation conditions are an implantation energy in the range of 70 to 100 keV ana a dose of $1 \times 10^{15}$ to $5 \times 10^{15}$ cm$^{-2}$ (FIG. 2G).

Figure 2H:
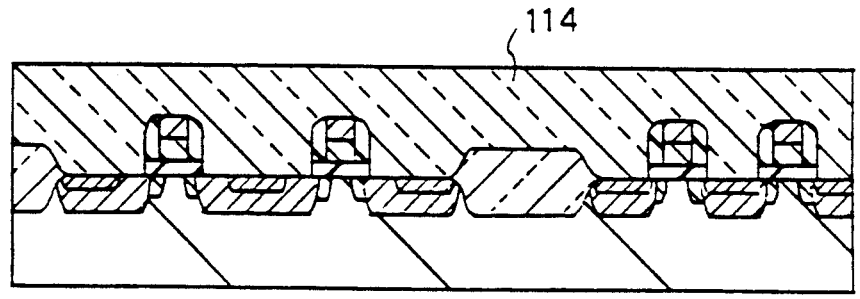

Next, an interlayer insulating film 114 with a thickness of about 1 μm is formed all over the surface by a CVD method (FIG. 2H). In the interlayer insulating film 114 there are formed contact holes 115 that reach the titanium silicide films 112a and 112b (FIGS. 1A and 1B).

The fabrication method in the above has been described with reference to the case of a N-channel MOSFET but the fabrication method is also applicable to a P-channel MOSFET. Further, the method is also applicable to a C-MOSFET and a Bi-CMOSFET.

Figure 9:
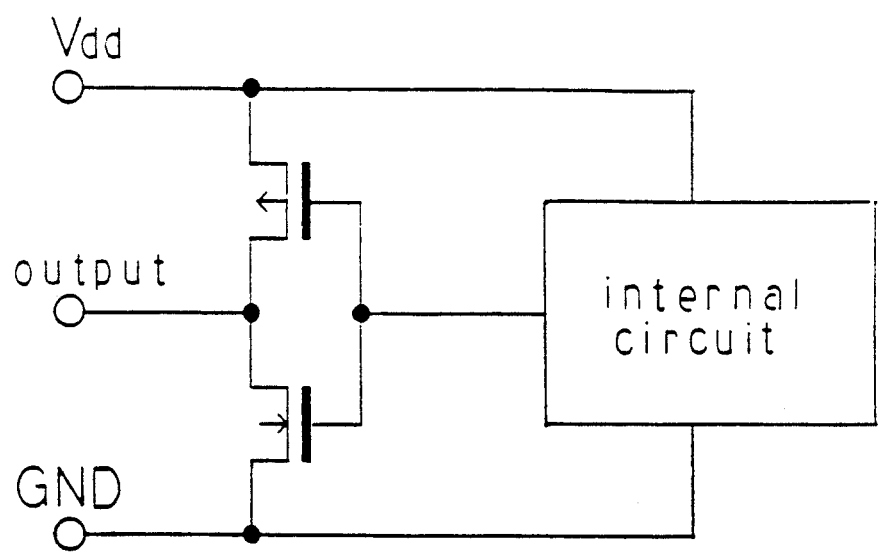
FIG. 9 is a schematic circuit diagram for describing the ESD measurement of the output buffer circuit.
Figure 10A:
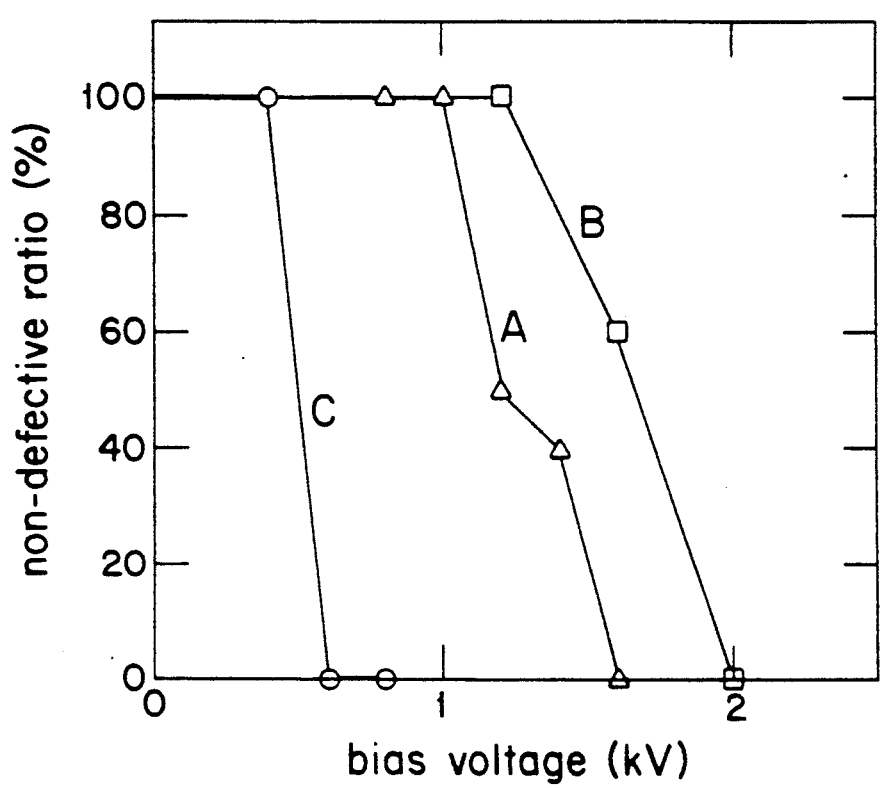
FIGS. 10A and 10B are diagrams for describing the effects of the first and the third embodiments, respectively, of the present invention, and are the graphs for showing the measurement result of the ESD of the output buffer circuits in the semiconductor integrated circuit devices that are applications of the first and the third embodiments of the present invention.
Figure 10B:
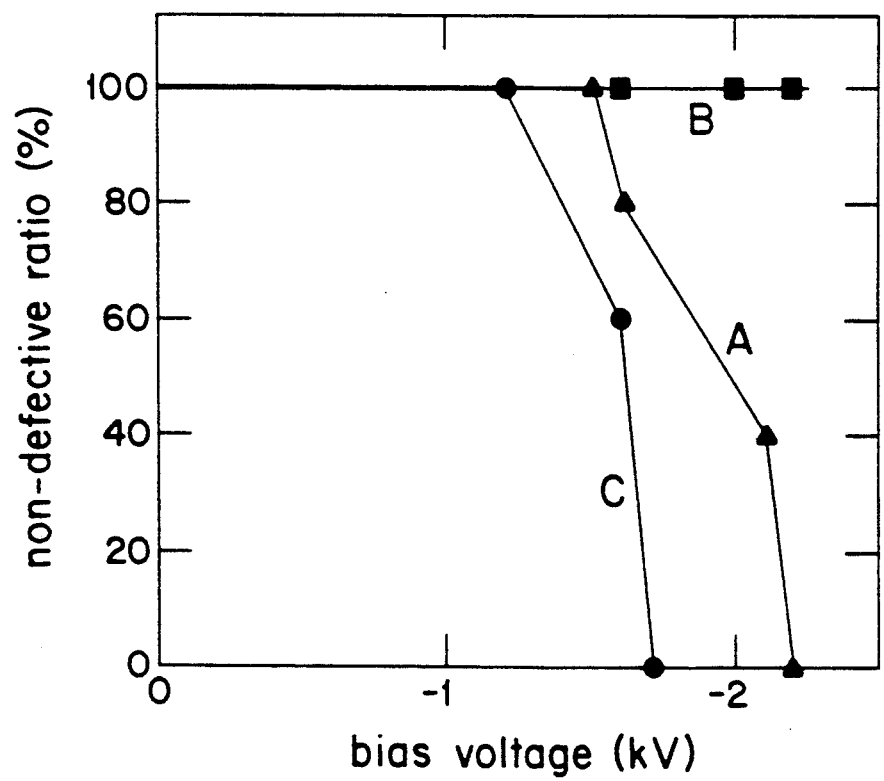

Referring to FIG. 9, and FIGS. 10A and 10B, the ESD related to the semiconductor integrated circuit device of the present embodiment will be described.

The buffer circuit and the internal circuit are constructed by using C-MOSFETs to which are applied the present embodiment. The output buffer circuit consists of a C-MOS inverter In the C-MOS inverter, the gate length L and the gate width W are 1.5 and 500 nm, respectively, for both cases of the N-channel MOSFET and the P-channel MOSFET. The thickness of the gate oxide film of the N-channel MOSFET and the P-channel MOSFET is about 21.5 nm. The gate electrode for both cases of the N-channel MOSFET and the P-channel MOSFET is constructed by a 200 nm thick tungsten silicide film and a 200 nm thick N+-type polycrystalline silicon film. The spacer is made of a silicon oxide film, and its width is about 200 nm. On the surface of the source-drain diffused layer for both cases of the N-channel MOSFET and the P-channel MOSFET there is formed a titanium silicide film with thickness of about 160 nm. The spacing d between the titanium silicide film and the gate electrode is 4 μm for both cases of the N-channel MOSFET and the P-channel MOSFET.

On the other hand, as a semiconductor integrated circuit device of the conventional structure, a device identical to the present embodiment except for the spacing d between the titanium silicide film and the gate electrode is 200 nm (spacer width) was manufactured. In this device, all over the surface of the source-drain diffused layer of the C-MOSFET that constitutes the output buffer circuit there is formed a titanium silicide film. In this C-MOS inverter the spacing between the gate electrode and the contact hole is 4 μm shorter than the device of the present embodiment.

For the two output buffer circuits described above, an ESD test based on MIL-STD-883C, Method 3015.2 was carried out. An example of the ESD test is that, in the circuit shown in FIG. 9, the GND terminal is taken as the standard, a bias voltage is applied between the output terminal and the GND terminal and the Vdd terminal, input terminal (not shown), I/O terminal (not shown) and another output terminal (not shown) are left opened. The results of the test are as shown in FIGS. 10A and 10B. FIG. 10A is a graph that shows the dependence of the non-defective ratio on the positive bias voltage, while FIG. 10B is a graph that shows the dependence of the non-defective ratio on the negative bias voltage.

In FIGS. 10A and 10B, the broken line A represents the result for the applied example of the present embodiment, and the broken line C represents the result for the conventional structure. As is clear from the figures, for the case of the positive bias voltage, the ESD resistance of the applied example of the present embodiment is enhanced to about 1.5 times that of the conventional structure. On the other hand, for the case of negative bias voltage, the ESD resistance of the applied example of the present embodiment is enhanced to about 1.2 times that of the conventional structure.

Figure 3:
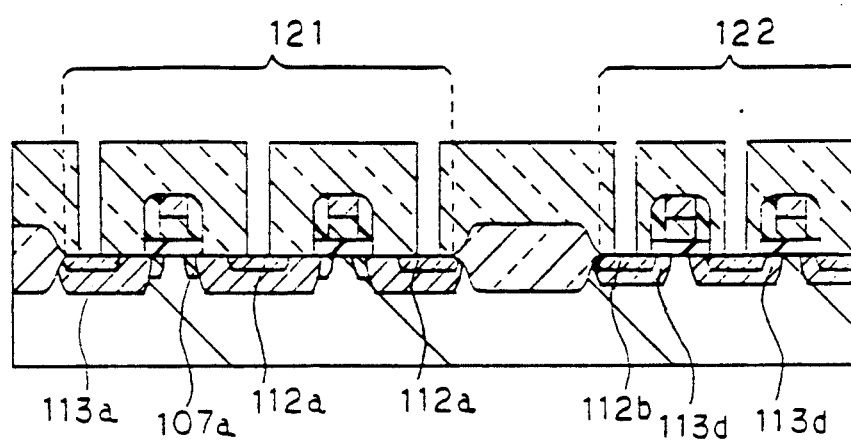
FIG. 3 is a schematic sectional view for describing a first example of an application of the first embodiment in the above.
Figure 4:
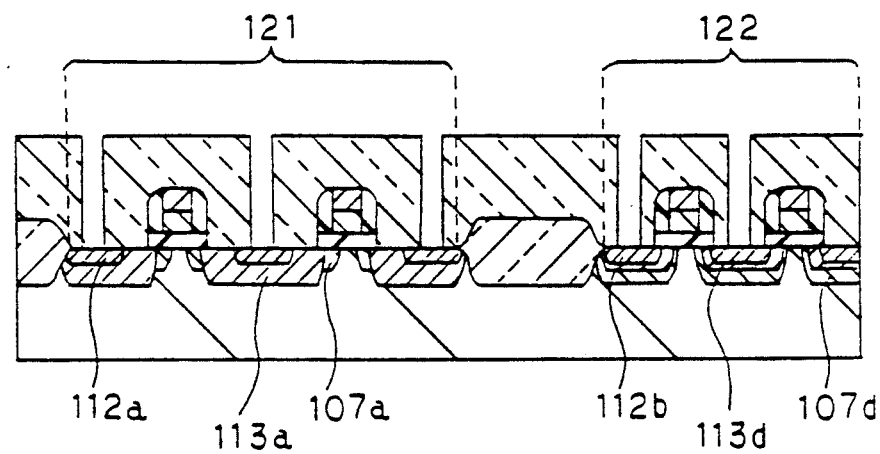
FIG. 4 is a schematic sectional view for describing a second example of an application of the first embodiment.
Figure 5:
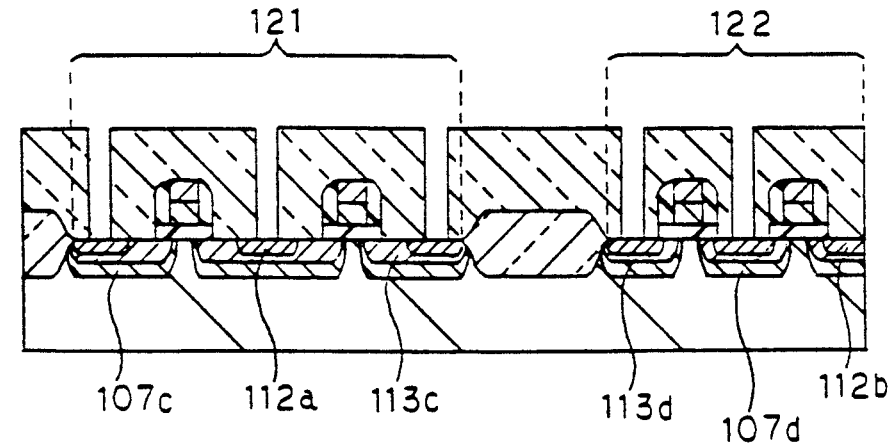
FIG. 5 is a schematic sectional view for describing a third example of an application of the first embodiment.

The first embodiment of the present invention represents the case of the application to the N-channel MOSFET which has a source-drain diffused layer of the LDD structure. This case is suited for the case when the buffer circuit and the internal circuit are driven by a relatively high source voltage, for example, of a 5 V class. FIG. 3, FIG. 4 and FIG. 5 are schematic sectional views for examples when the first embodiment is applied to N-channel MOSFETs having source-drain diffused layers of other structures (or combinations with other structures).

Referring to FIG. 3 which is a schematic sectional view for describing the first applied example of the first embodiment, the first N-channel MOSFET of the buffer circuit region 121 in this applied example is the same as that of the first embodiment. On the other hand, the second N-channel MOSFET of the internal circuit region 122 has a source-drain diffused layer of the single drain structure. This source-drain diffused layer is constructed by the titanium silicide film 112b and an N+-type source-drain diffused layer 113d formed in self-alignment with the gate electrode.

The present applied example is suited for a semiconductor integrated device in which the peripheral circuits containing the buffer circuit are driven by a source voltage of a 5 V class and the internal circuit is driven, for example, by a source voltage of a 3.3 V class. In the present applied example it is possible to make the internal circuit region have a finer geometry than in the first embodiment, and hence the device can be made to have higher operating speed than the case of using the first embodiment.

The key points of the fabrication method of the present applied example will be described. After formation of the gate electrodes, the internal circuit region 122 is covered with a photoresist film, and an N−-type source-drain diffused layer 107a is formed by the ion implantation of phosphorus. Then, the buffer circuit region 121 is covered with another photoresist film, and an N+-type source-drain diffused layer 113d is formed by ion implantation of arsenic under the implantation conditions of 70 keV and $1 \times 10^{15}$ cm$^{-2}$. Besides these points, the process of the present applied example that differs from the first embodiment is that the internal circuit region 122 is covered with a photoresist film at the time of ion implantation in the formation of the N+-type source-drain drain diffused layer 113a.

Referring to FIG. 4 which is a schematic sectional view for describing the second applied example of the first embodiment, the second N-channel MOSFET of the internal circuit region 122 in the present applied example has a source-drain diffused layer of the LDD structure. This source-drain diffused layer consists of a titanium silicide film 112b, an N−-type source-drain diffused layer 107d formed in self-alignment with the gate electrode and an N+-type source-drain diffused layer 113d.

Analogous to the first applied example, the present applied example is adapted for a semiconductor integrated circuit whose peripheral circuits including the buffer circuit are driven by a source voltage of a 5 V class, and whose internal circuit is driven, for example, by a source voltage of a 3.3 V class. Compared with the first applied example, the present applied example has a higher reliability for the hot carriers.

The principal points of the method of fabricating the present applied example will be described. After formation of the gate electrodes, the internal circuit region 122 is covered with a photoresist film, and an N⁻-type source-drain diffused layer 107a is formed by ion implantation of phosphorus. Then, the buffer circuit region 121 is covered with another photoresist, and an N⁻-type source-drain diffused layer 107d is formed by ion implantation of phosphorus under the conditions of 70 keV and $1 \times 10^{14}$ cm$^{-2}$ or so. Further, an N⁺-type source-drain diffused layer 113d is formed by ion implantation of arsenic under the approximate conditions of 70 keV and $1 \times 10^{15}$ cm$^{-2}$. Besides these, the process which is different from that of the first embodiment is that the internal circuit region 122 is covered with a photoresist film at the time of ion implantation for the formation of the N⁺-type source-drain diffused layer 113a.

Referring to FIG. 5 which is a schematic sectional view for describing the third applied example of the first embodiment, the first MOSFET of the buffer circuit region 121 and the second MOSFET of the internal circuit region 122 in the present applied example have a source-drain diffused layer of the LDD structure. The source-drain diffused layer of the first MOSFET is constituted of a titanium silicide film 112a, an N⁻-type source-drain diffused layer 107c formed in self-alignment with the gate electrode and an N⁺-type source-drain diffused layer 113c formed in self-alignment with the gate electrode.

The present applied example is adapted for a semiconductor integrated circuit device in which the peripheral circuit including the buffer circuit, and the internal circuit are driven by a relatively low, for example 3.3 V class voltage The principal points of the fabrication method of the present applied example are the formation of the gate electrodes, followed by the formation of N⁻-type source-drain diffused layers 107c and 107d by ion implantation of phosphorus under approximate conditions of 70 keV and $1 \times 10^{14}$ cm$^{-2}$, followed further by the formation of N⁺-type source-drain diffused layers 113c and 113d by ion implantation of arsenic under approximate conditions of 70 keV and $1 \times 10^{15}$ cm$^{-2}$.

Referring to FIGS. 6A to 6D which are schematic sectional views arranged in the order of the processes for describing the fabrication method of the second embodiment of the present invention, it can be seen that the present embodiment can be applied to the first embodiment and the applied examples of the first embodiment, and can also be applied to the case where the second metal is the same as the first metal and to the case where the gate electrodes are made of a metallic film. In the present embodiment, description will be presented for the case of the N-channel MOSFET where the first metal and the second metal are titanium.

Figure 6A:
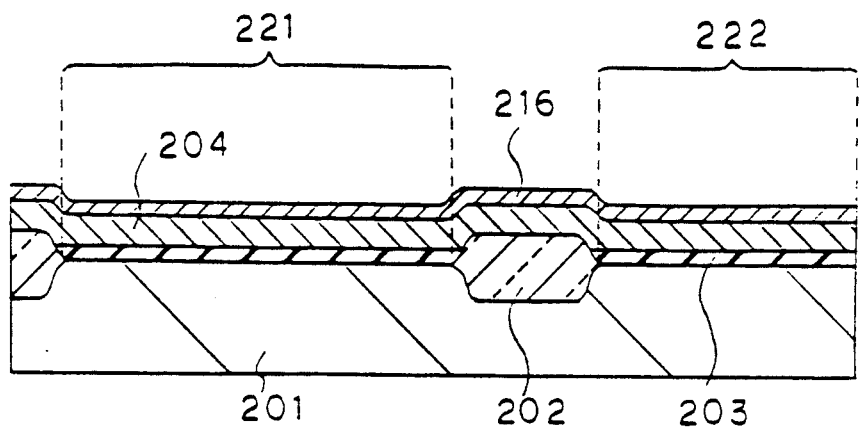
FIGS. 6A to 6D are schematic sectional views arranged in the order of processes for describing the fabrication method of a second embodiment of the present invention.
Figure 6B:
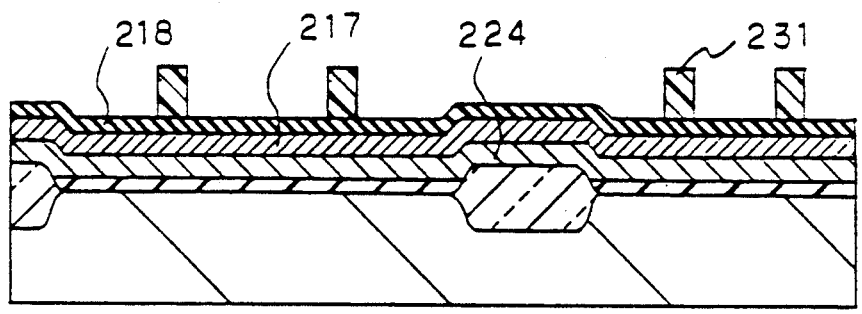

First, on the surface of a P-type silicon substrate 201 there is formed a field oxide film 202 with a thickness of about 800 nm by a selective oxidation method. As a result of the formation of the field oxide film 202, a buffer circuit 221 and an internal circuit region 222 that are respectively surrounded by the oxide film 202 are formed simultaneously. On the surface of the regions 221 and 222 there is formed a gate oxide film 203 with a thickness of 21.5 nm by a thermal oxidation method. Next, an N-type polycrystalline silicon film 204 with thickness of about 300 nm is formed all over the surface by a CVD method and a titanium film 216 of a thickness of about 100 nm is deposited by a sputtering method (FIG. 6B).

Next, the sample is subjected to a heat treatment at 600° to 800° C. in an inert atmosphere. As a result of this heat treatment a titanium silicide film 217 with a thickness of about 200 nm is formed, and at the same time the N-type polycrystalline silicon film 204 is converted to a N-type polycrystalline silicon film 224 with a thickness of about 200 nm. The sheet resistance of this laminated film is about 2 Ω/□. Then, a silicon oxide film 218 with a thickness of about 200 nm is deposited by a CVD method. On the silicon oxide film 218 there is formed a photoresist film 231. The photoresist film 231 is the etching mask for gate electrodes (FIG. 6B).

Figure 6C:
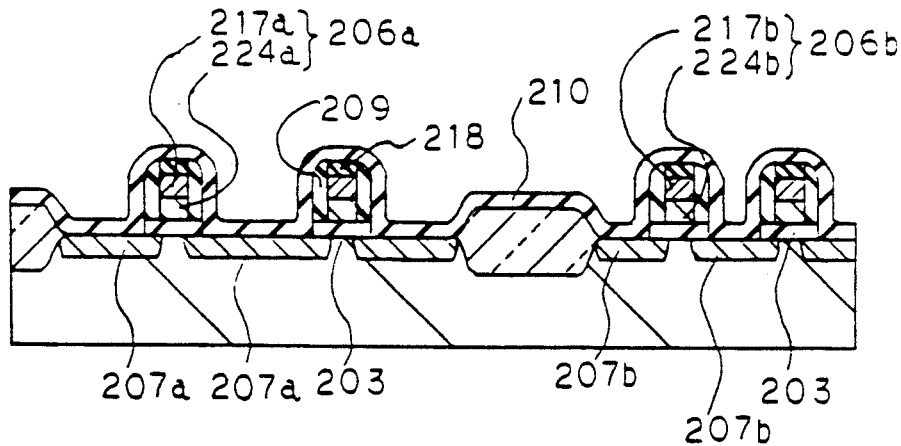

Next, the silicon oxide film 218, the titanium silicide film 217 and the polycrystalline silicon film 224 are sequentially etched by using the photoresist film 231 as the mask. As a result, gate electrodes 206a and 206b of the polycide structure for the first and the second MOSFETs are formed. The gate electrode 206a is formed by the N-type polycrystalline silicon film 224a and the titanium silicide film 217a. The gate electrode 206b is formed by the N-type polycrystalline silicon film 224b and the titanium silicide film 217b. On the top faces of the gate electrodes 206a and 206b there is remaining the silicon oxide film 218. The N⁻-type source-drain regions 207a and 207b of the first and the second MOSFETs are formed by ion implantation of phosphorus. After removal of the photoresist film 231, a silicon oxide film with a thickness of about 200 nm is deposited all over the surface by a CVD method, and a spacer 209 is formed by etching back the silicon film. In this process of etching-back, the thickness of the silicon oxide film 218 is reduced somewhat, but a thickness of about 150 nm still remains. A silicon oxide film 210 with a thickness of about 30 nm is deposited all over the surface by a CVD method (FIG. 6C).

Figure 6D:
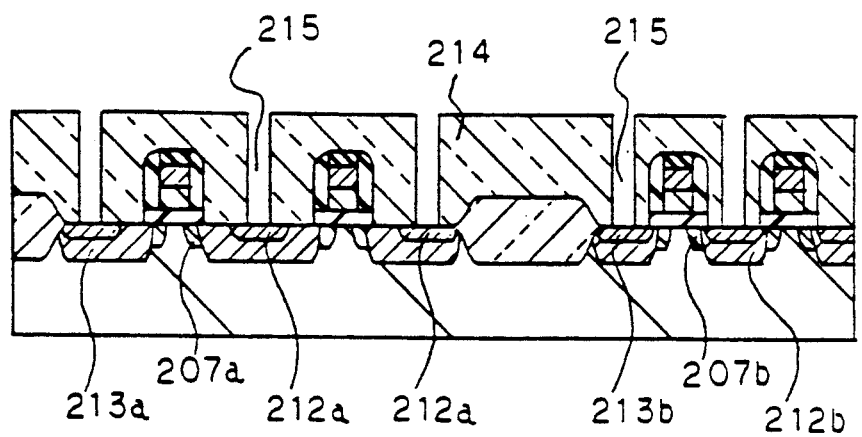

Following that, titanium silicide films 212a and 212b, N⁺-type source-drain diffused layers 213a and 213b are formed by the same method as in the fabrication of the first embodiment, an interlayer insulating film 214 is deposited by a CVD method, and contact holes 215 are formed (FIG. 6D).

Since the present embodiment has a sheet resistance of the gate electrode which is smaller than that of the first embodiment, there can be obtained a semiconductor integrated circuit device with higher operating speed.

It is to be noted that a method is employed in the present embodiment by which the titanium silicide film 217 and the titanium silicide film 212 are formed separately. The reason for doing so is that if a method is employed in which a pattern for the gate electrodes is formed first by means of a polycrystalline silicon film alone, followed by the formation of the spacers, and the gate electrodes are silicified simultaneous with the source-drain forming region, then the shape of the gate electrodes tends to be deformed due to volume expansion of the gate electrode part, which renders the fine geometry of the gate electrodes extremely difficult.

Figure 7A:
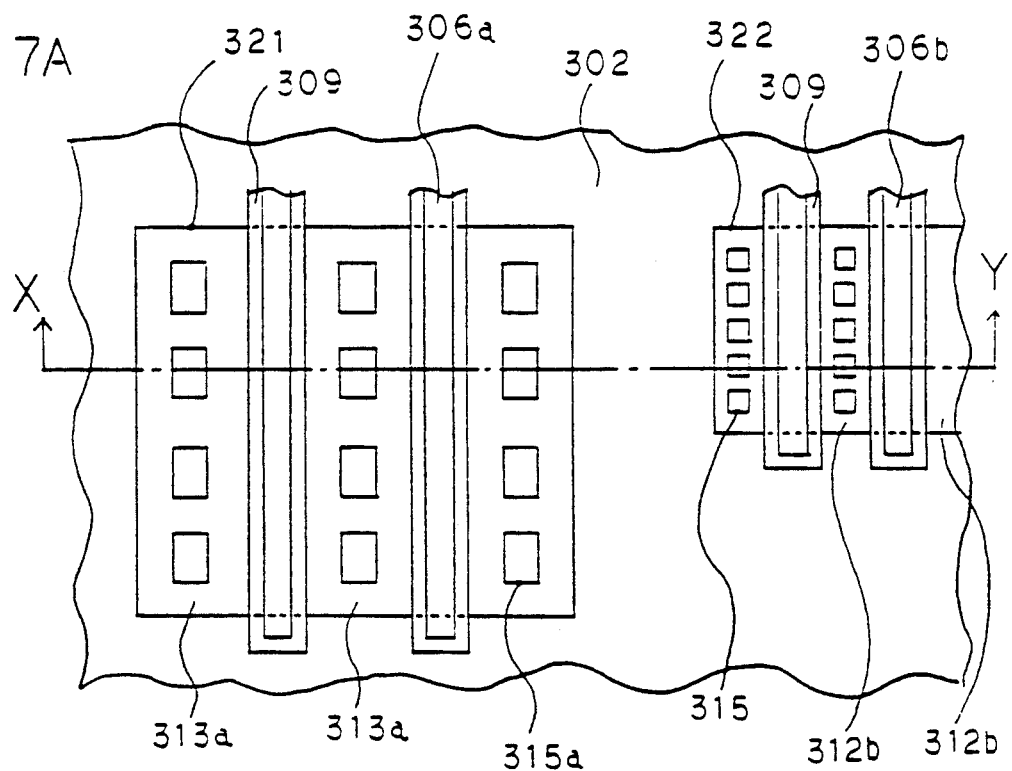
FIG. 7A is a schematic plan view for describing a third embodiment of the present invention.
Figure 7B:
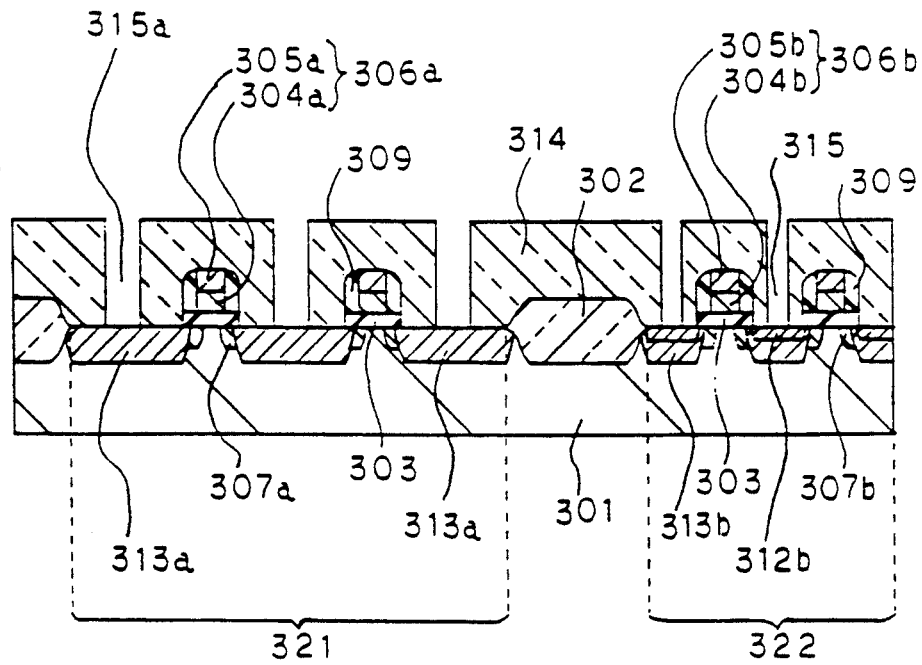
FIG. 7B is a schematic sectional view of the third embodiment in FIG. 7A along the line XY.

Referring to FIGS. 7A and 7B, there are shown a schematic plan view and a schematic sectional view for describing the constitution of a third embodiment of the present invention. Also in this embodiment, a semiconductor integrated circuit device is constructed only by N-channel MOSFETs having source-drain diffused layers of the LDD structure for the purpose of simplifying the description.

Selectively formed on the surface of an N-type silicon substrate 301 is a field oxide film having a thickness of about 800 nm. By the field oxide film 302, a buffer circuit region 321 and an internal circuit region 322 are partitioned over the surface of the silicon substrate 301. In the buffer circuit region 321 and the internal circuit region 322 there are provided a first N-channel MOSFET and a second N-channel MOSFET, respectively.

The first and the second MOSFETs have a gate oxide film 303 with thickness of 21.5 nm. The first and the second MOSFETs have gate electrodes 306a and 306b, respectively, of the polycide structure. The gate electrode 306a is formed by an N+-type polycrystalline silicon film 304a and a tungsten silicide film 305a, and the gate electrode 306b is formed by an N+-type polycrystalline silicon film 304b and a tungsten silicide film 305b. The thickness of the polycrystalline silicon films 304a and 304b is about 200 nm, and the thickness of the tungsten silicide films 305a and 305b is about 200 nm. The sheet resistance of the gate electrodes 306a and 306b is about 6 $\Omega/\square$. On the side faces of the gate electrodes 306a and 306b there is formed a spacer 309 made of silicon oxide film having a width of about 200 nm.

The first and the second MOSFETs have N−-type source-drain diffused layers 307a and 307b that are formed in a self-alignment manner with the gate electrodes 306a and 306b. The first and the second MOSFETs have N+-type source-drain diffused layers 313a and 313b that are formed in a self-alignment manner with the spacer 309 and the gate electrode 306a, and the spacer 309 and the gate electrode 306b, respectively. On the surface of the N+-type source and drain diffused layers 313b there are formed titanium silicide films 312b self-aligned with the layer 313b. The thickness of the titanium silicide film 312b is about 160 nm, and its sheet resistance is about 2 $\Omega$/ square. On the other hand, the source and drain regions 313a have no metal silicide film. The sheet resistance of the N+-type source-drain diffused layers 313a and 313b individually is about 400 $\Omega$/square.

On the surface of the semiconductor integrated circuit device there is formed an interlayer insulating film 314 with a thickness of about 1 $\mu$m. In the interlayer insulating film 314 there are provided contact holes 315a and 315 that reach the N+-type source drain diffused layer 313a and the titanium silicide film 312b, respectively. The titanium silicide film 312b functions as a barrier metal. Because of this, the increase in the contact resistance will not be large even if the diameter of the contact hole 315 is made small. Since, however, there exists no film for the contact hole 315a which functions as a barrier metal so that its diameter has to be made larger than the diameter of the contact hole 315.

The gate electrodes and the source-drain diffused layer of the internal circuit region 322 in the present embodiment will lead to no inconvenience even if they are diverted for use as a part of the wirings. This becomes possible since the sheet resistance of these components is made sufficiently low compared with the conventional ones.

Moreover, in the first N-channel MOSFET that constitutes the buffer circuit of the present embodiment, the source-drain region between the gate electrode 306a and the contact hole 315a is constructed by the N+-type source-drain diffused layer 313a that has a sheet resistance of the order of 40 $\Omega/\square$. Therefore, even if a discharge current flows into the source-drain diffused layer of the buffer circuit from an external device, the thermal breakdown at the edges of the gate electrode 306a can be made less easy to occur.

Figure 8A:
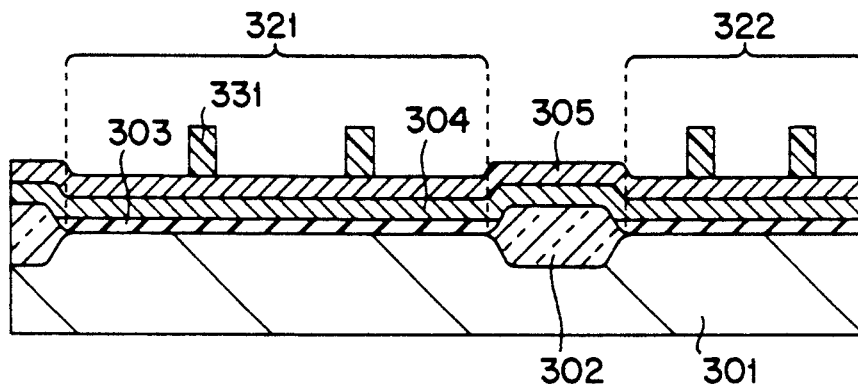
FIGS. 8A to 8F are schematic sectional views arranged in the order of processes for describing the fabrication method of the semiconductor integrated circuit device according to the third embodiment.

Next, referring to FIGS. 8A to 8F for showing the fabrication method of the third embodiment of the semiconductor integrated circuit device along with FIGS. 7A and 7B, first, the field oxide film 302 with a thickness of about 800 nm is formed by a selective oxidation method on the surface of the P-type silicon substrate 301. As a result of the formation of the field oxide film 302, the buffer circuit region 321 and the internal circuit region that are respectively surrounded by the field oxide film 302 are formed simultaneously. The gate oxide film 303 with a thickness of 21.5 nm is formed by a thermal oxidation method on the surface of the regions 321 and 322. Next, the N+-type polycrystalline silicon film 304 having a thickness of about 200 nm is formed all over the surface by a CVD method. Following that, the tungsten silicide film 305 with a thickness of about 200 nm is deposited all over the surface by a sputtering method. On the tungsten silicide film 305 there is formed a pattern of a photoresist film 331. The photoresist film 331 is the etching mask for the gate electrodes (FIG. 8A).

Figure 8B:
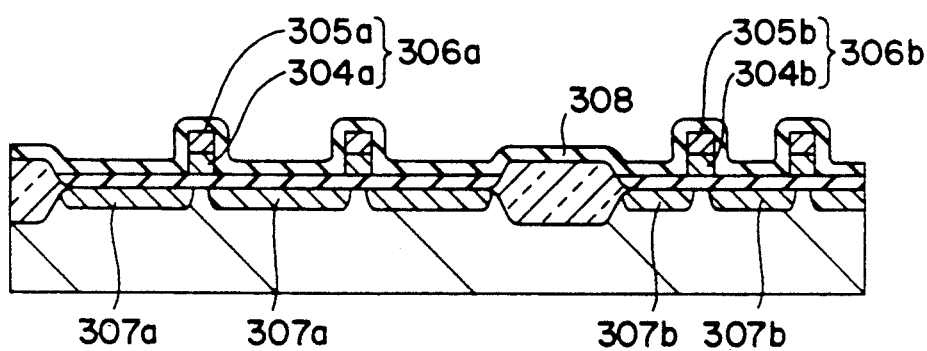

Next, using the photoresist film 331 as the mask, the tungsten silicide film 305 and the polycrystalline silicon film 304 are etched successively. As a result, the gate electrodes 306a and 306b of the polycide structure for the first and the second MOSFETs are formed. The gate electrode 306a is formed by the N+-type polycrystalline silicon film 304a and the tungsten silicide film 305a, and the gate electrode 306b is formed by the N+-type polycrystalline silicon film 304b and the tungsten silicide film 305b. Then, N−-type source-drain regions 307a and 307b of the first and the second MOSFETs are formed by ion implantation of phosphorus. The conditions of the phosphorus ion implantation are an implantation energy in the range of 20 to 100 keV, and a dose of $1 \times 10^{13}$ cm$^{-2}$. After removal of the photoresist film 331, a silicon oxide film 308 with a thickness of about 200 nm is deposited all over the surface by a CVD method (FIG. 8B).

Figure 8C:
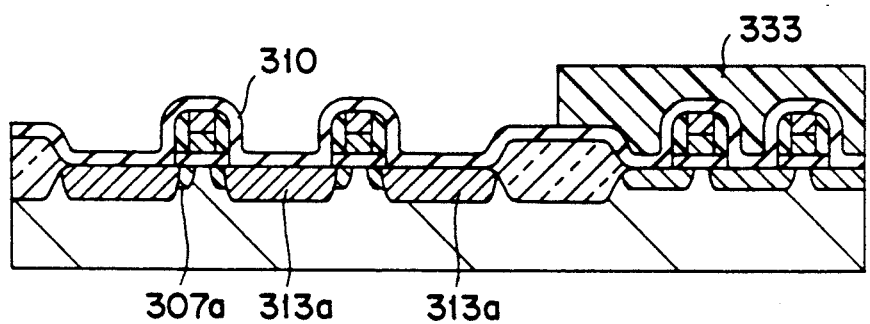

Next, the silicon oxide film 308 is etched back to form a spacer 309 made of a silicon oxide film on the side faces of the gate electrodes 306a and 306b. Then, a silicon oxide film 310 with a thickness of about 30 nm is deposited all over the surface by a CVD method. A photoresist film 333 which covers the internal circuit region 322 is formed. Then, an N+-type source-drain diffused layer 313a of the fifth MOSFET is formed by ion implantation of arsenic which uses the film 333 as a mask (FIG. 8C)

Figure 8D:
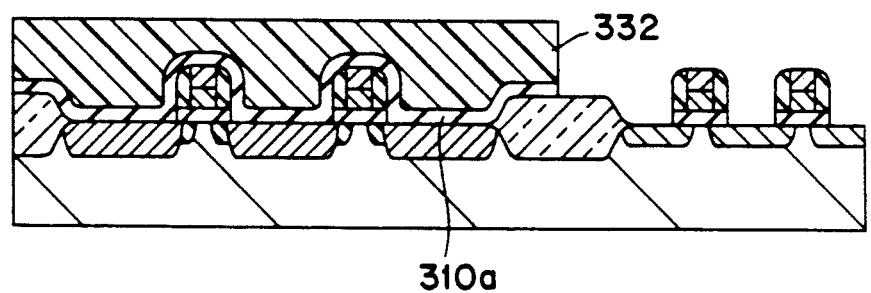

Next, after removal of the photoresist film 333, a pattern of a photoresist film 332 is formed on the buffer circuit region 321. The silicon oxide film 310 is etched with the photoresist film 333 as the mask to form a silicon oxide film 310a (FIG. 8D).

Figure 8E:
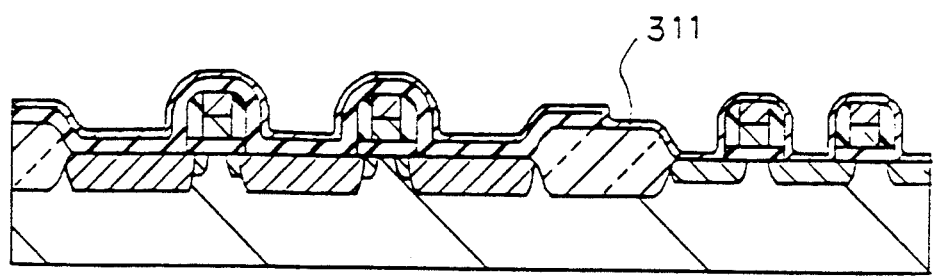

Next, the photoresist film 332 is removed, and a titanium film 311 is deposited all over the surface by a sputtering method (FIG. 8E).

Figure 8F:
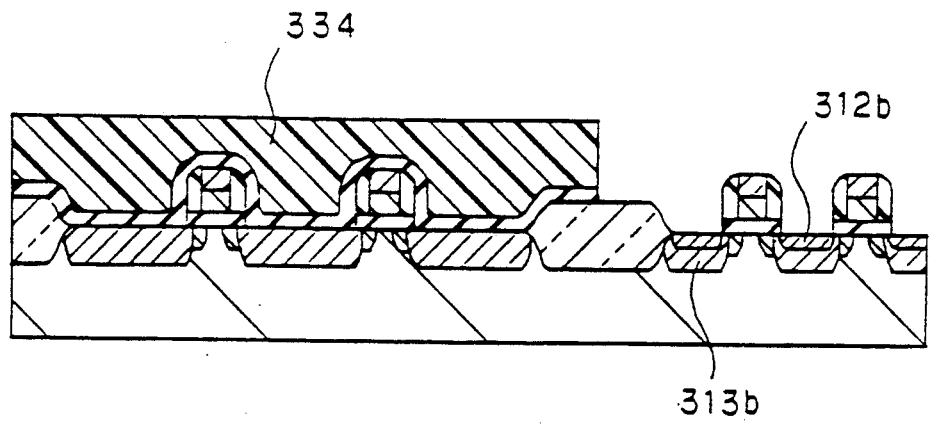

Next, a titanium silicide film 312b is formed by a heat treatment at 600° to 800° C. in an inert atmosphere. The unreacted titanium film 311 is removed by etching. A photoresist film 334 having an opening in the internal circuit region 322 is formed, and using this film as the mask there is formed an N+-type source-drain diffused layer 313b of the second N-channel MOSFET by ion implantation of arsenic (FIG. 8F).

Next, the photoresist film 334 is removed, and the silicon oxide film 310a is removed by etching. An interlayer insulating film 314 with a thickness of about 1 µm is formed all over the surface by a CVD method. Then, contact holes 315 and 315a that reach the titanium silicide film 312b and the N+-type source-drain diffused layer 313a, respectively, are formed in the interlayer insulating film 314 (FIGS. 7A and 7B). Because of the presence of the contact hole 315a, the area of the N+-type source-drain diffused layer can be made greater than that of the first embodiment.

The fabrication method of the present embodiment has been described with reference to the case of a N-channel MOSFET, but the fabrication method can also be applied to a P-channel MOSFET. Moreover, the method can also be applied to a C-MOSFET and a Bi-CMOSFET.

Next, a description will be given about the ESD of the semiconductor integrated circuit device which is applied to the present embodiment. The semiconductor integrated circuit device is fabricated in accordance with the applied example of the first embodiment. As is clear from the broken line B in FIGS. 10A and 10B, the result of measurement on ESD shows that the ESD resistance of the present embodiment is further enhanced than that of the first embodiment.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

I claim:

1. A semiconductor integrated circuit device, comprising: a buffer circuit including a first MOSFET to interface with an external device and an internal circuit operatively coupled to said buffer circuit and including a second MOSFET, said first MOSFET having a first gate electrode formed on a first insulating film covering a first channel region, a first source region and a first drain region, each of said first source and first drain regions having a first end portion defining said first channel region, said second MOSFET having a second gate electrode formed on a second insulating film covering a second channel region, a second source region and a second drain region, each of said second source and second drain regions having a second end portion defining said second channel region, said first MOSFET further having a first silicide film selectively formed on a surface of at least one of said first source and first drain regions at a first distance from said first end portion, and said second MOSFET further having a second silicide film selectively formed on a surface of at least one of said second source and second drain regions at a second distance from said second end portion, said first distance being larger than said second distance.

2. The semiconductor integrated circuit device as claimed in claim 1, wherein each of said first and second gate electrodes includes a third silicide film of a first metal and each of said first and second silicide films is made of silicon and a second metal.

3. The semiconductor integrated circuit device as claimed in claim 2, wherein said first metal is selected from tungsten, molybdenum and titanium and said second metal is selected from titanium, cobalt and tantalum.

4. A semiconductor integrated circuit device, comprising: a buffer circuit including a first MOSFET to interface with an external device and an internal circuit operatively coupled to said buffer circuit and including a second MOSFET, each of said first and second MOSFETs having a gate electrode and source and drain regions, said second MOSFET further having a silicide film formed on the surface of at least one of said source and drain regions thereof, wherein said first MOSFET has no silicide film in contact with said source and drain regions thereof to increase the resistance of said source and drain regions of said first MOSFET to be greater than the resistance of said at least one of said source and drain regions of said second MOSFET having formed thereon said silicide film.

5. The semiconductor integrated circuit device as claimed in claim 4, wherein each said gate electrode includes a silicide film of a first metal and said silicide film formed on the surface of said at least one of said source and drain regions of said second MOSFET is made of silicon and a second metal.

6. The semiconductor integrated circuit device as claimed in claim 5, wherein said first metal is selected from tungsten, molybdenum and titanium and said second metal is selected from titanium, cobalt and tantalum.

* * * * *